(12) United States Patent
Jeong et al.

(10) Patent No.: US 10,566,478 B2
(45) Date of Patent: Feb. 18, 2020

(54) THIN-FILM SOLAR CELL MODULE STRUCTURE AND METHOD OF MANUFACTURING THE SAME

(71) Applicant: KOREA INSTITUTE OF SCIENCE AND TECHNOLOGY, Seoul (KR)

(72) Inventors: Jeung-Hyun Jeong, Seoul (KR); Jong-Keuk Park, Seoul (KR); Won Mok Kim, Seoul (KR); Seung Hee Han, Seoul (KR); Doh Kwon Lee, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 15/705,342

(22) Filed: Sep. 15, 2017

(65) Prior Publication Data

US 2018/0108795 A1    Apr. 19, 2018

(30) Foreign Application Priority Data

Oct. 19, 2016 (KR) ................... 10-2016-0136026

(51) Int. Cl.
*H01L 31/18* (2006.01)
*H01L 31/0463* (2014.01)
*H01L 31/0224* (2006.01)
*H01L 31/032* (2006.01)
*H01L 31/0392* (2006.01)
*H01L 31/0468* (2014.01)

(52) U.S. Cl.
CPC .. *H01L 31/0463* (2014.12); *H01L 31/022425* (2013.01); *H01L 31/0322* (2013.01); *H01L 31/0324* (2013.01); *H01L 31/0326* (2013.01); *H01L 31/03923* (2013.01); *H01L 31/0468* (2014.12); *H01L 31/1888* (2013.01); *Y02E 10/50* (2013.01); *Y02P 70/521* (2015.11)

(58) Field of Classification Search
CPC ......... H01L 31/0463; H01L 31/022425; H01L 31/0324; H01L 31/1888; H01L 31/0462; H01L 31/18; H01L 31/0322
USPC ....................................................... 136/256
See application file for complete search history.

(56) References Cited

U.S. PATENT DOCUMENTS

| | | | |
|---|---|---|---|
| 2008/0105303 A1* | 5/2008 | Oswald | ................. B23K 26/03 136/261 |
| 2013/0014800 A1* | 1/2013 | Stephens | ............ H01L 31/0463 136/244 |
| 2013/0081688 A1 | 4/2013 | Liang et al. | |
| 2013/0168797 A1 | 7/2013 | Rekow | |
| 2015/0068580 A1 | 3/2015 | Probst | |

(Continued)

FOREIGN PATENT DOCUMENTS

KR    1020140138254 A    12/2014
KR    1020160050929 A    5/2016

OTHER PUBLICATIONS

Chan-Wook Jeon et al., "Controlled formation of MoSe2 by MoNx thin film as a diffusion barrier against Se during selenization annealing for CIGS solar cell", Journal of Alloys and Compounds, Apr. 28, 2015, pp. 317-323, vol. 644, Elsevier B.V.

(Continued)

*Primary Examiner* — Matthew T Martin
(74) *Attorney, Agent, or Firm* — Cantor Colburn LLP

(57) ABSTRACT

Provided are a thin-film solar cell module structure and a method of manufacturing the same.

7 Claims, 14 Drawing Sheets

(56) References Cited

U.S. PATENT DOCUMENTS

2015/0114446 A1    4/2015   Probst

OTHER PUBLICATIONS

H. Simchi et al., "Structure and interface chemistry of MoO3 back contacts in Cu(In,Ga)Se2 thin film solar cells", Journal of Applied Physics, 2014, p. 033514-1-033514-8, vol. 115, AIP Publishing LLC.
Tokio Nakada et al., "Microstructural and diffusion properties of CIGS thin film solar cells fabricated using transparent conducting oxide back contacts", Thin solid films, 2005, pp. 419-425, vol. 480-481, Elsevier B.V.

* cited by examiner

THIN-FILM SOLAR CELL MODULE STRUCTURE AND METHOD OF MANUFACTURING THE SAME

CROSS-REFERENCE TO RELATED APPLICATION

This application claims the benefit of Korean Patent Application No. 10-2016-0136026, filed on Oct. 19, 2016, in the Korean Intellectual Property Office, the disclosure of which is incorporated herein in its entirety by reference.

This work was supported by the Korea Institute of Energy Technology Evaluation and Planning (KETEP) and the Ministry of Trade, Industry & Energy (MOTIE) of the Republic of Korea (20153030013060).

BACKGROUND

1. Field

One or more embodiments relate to a thin-film solar cell module structure and a method of manufacturing the same, and more particularly, to a thin-film solar cell module structure and a method of manufacturing the thin-film solar cell module structure by applying a technique employing a substrate-incident laser to a scribing process of the thin-film solar cell module structure, in order to improve performance of a thin-film solar cell module structure.

2. Description of the Related Art

Application fields of photovoltaic modules have expanded beyond traditional solar power plants for large-scale electricity production to building-integrated photovoltaics (BIPVs) using urban buildings, vehicle-integrated photovoltaics (VIPVs) for application to vehicles such as cars and buses, device-integrated photovoltaics (DIPVs) for use in portable devices. Of these photovoltaics, building-integrated photovoltaics (BIPVs) may be classified into those applied to building roofs, walls, or windows, wherein a certain amount of light transmission is required for window-type (see-through) photovoltaic modules.

In order to cope with such market needs, amorphous thin-film silicon (Si) solar cells may ensure transparency by removing a light absorption layer from the same by laser scribing, while crystalline Si wafer solar cells may ensure transparency by using a gap region between cells where no cell is applied.

However, amorphous thin-film Si (a-Si) solar cells have a photovoltaic conversion efficiency (PCE) as low as about 11% at small-scale device, and their large-scale modules have a very low PCE of about 5% or less due to cell-to-module loss (CTM) of the PCE and an additional loss accompanied with ensured transparency, and thus it is difficult to extract a substantial quantity of photoelectric power generation from the see-through a-Si thin film solar modules. Furthermore, it is inherently impossible for a crystalline Si cell to have transparency, which makes it difficult to apply the crystalline Si cell to a window, in view of the esthetic nature of building designing. Such a transparent photovoltaic module is required to provide residents inside the building additional various functional options (for example, tuning color of the skylight) in aesthetic aspects.

A selenium (Se)-based or sulfur (S)-based thin-film solar cell made of $Cu(In_{1-x}, Ga_x)(Se,S)_2$ (CIGS) or $Cu_2ZnSn(Se,S)_4$ (CZTS) is formed by depositing molybdenum (Mo) on a glass substrate or a metal substrate or a polymer substrate as a rear electrode, forming a CIGS light absorption layer (or a CZTS light absorption layer) as a p-type light absorption layer, and successively depositing a CdS (or ZnS, $In_2S_3$) thin film and an intrinsic ZnO (or ZnMgO) film as n-type window layers, and a transparent conductive oxide (TCO) electrode. Compared to an existing Si solar cell, such a CIGS or CZTS solar cell leads to reduced production costs due to its thin-film structure, and a high power conversion efficiency (PCE) of 20% or greater, and thus is regarded as a strong candidate in the next-generation solar cell market.

FIG. 1 illustrates a monolithically integrated module structure of a conventional CIGS light absorption layer-based thin-film solar cell using a Mo rear electrode. An advantage in manufacturing a thin-film solar cell module structure is that it is possible to implement monolithic integration of the thin-film solar cell with a structure as illustrated in FIG. 1. The thin-film solar cell module structure may be configured by isolating individual unit cells through a first patterning process P1 of a Mo rear electrode, a second patterning process P2 after deposition of CIGS/CdS/i-ZnO, and a third patterning process P3 after deposition of TCO, and connecting adjacent cells in series through TCO/Mo connection in a second patterning (P2) region. In FIG. 1, as part of the entire module structure, a series-connected structure of three cells is illustrated. A monolithically integrated solar cell module structure may be configured by iterative series connection of structures as illustrated in FIG. 1.

FIG. 2 is a diagram showing a process of manufacturing a conventional CIGS thin-film solar cell module structure. First, after deposition of a molybdenum (Mo) rear electrode on a substrate, the rear electrode is electrically isolated through the first patterning process P1 using a laser scriber. After a light absorption layer, a CdS buffer layer and an i-ZnO layer are deposited thereon, the surface of the rear electrode is exposed through the second patterning process P2 using a mechanical scriber to the light absorption layer, the CdS buffer layer, and the i-ZnO layer. Then, after a transparent electrode layer is deposited, adjacent cells are electrically isolated through the third patterning process P3 using a mechanical scriber. In this case, in the second patterning P2 region, the TCO layer serving as an upper electrode and the Mo rear electrode may contact each other, connecting the adjacent cells in series.

In the mechanical scribing applied in the second patterning process P2 and the third patterning process P3, equipment costs are relatively low compared to the laser scriber. However, except for this, using the mechanical scriber may cause a productivity problem such as an increased defective rate due to changes in scribing width and quality caused from abrasion of a scribing tip during a module manufacturing process, and thus the scribing tip should be replaced frequently, which may increase manufacturing costs. In addition, patterning by mechanical scribing may make it difficult to reduce a line width to a certain level or below, and thus a "dead zone" as illustrated in FIG. 1, the area where photovoltaic power generation and photocurrent collection are impossible may be enlarged, thus reducing the amount of power generated by the module.

To solve this problem, there is a need to develop a laser scribing technology readily applicable to the second patterning process P2 and the third patterning process P3. In the second patterning process P2 and the third patterning process P3, laser is incident from a transparent window layer, unlike in the first patterning process P1 in which both the substrate incidence and film incidence of laser are available. In this regard, in order to reduce damage of the Mo rear electrode, it is required to suppress the heat transfer to the Mo rear electrode caused from laser heating. To this end, there is a need to use an expensive laser source such as tens-of-picoseconds (ps) laser pulses or femtoseconds (fs) laser pulses.

In addition, reaction products on the surface of the Mo rear electrode which may be generated during removal of the CIGS light absorption layer by laser heating may increase interfacial resistance of TCO/Mo in the second patterning P2 region, consequently increasing series resistance of the module. Furthermore, residues such as debris generated during the scribing process may cause shunting between cells or non-uniformity problems in following thin film deposition.

As one of the solutions to these drawbacks, KR 10-2016-0050929 discloses a processing technology, including the first, second, and third patterning processes P1, P2, and P3, of applying substrate-incident laser onto a stack structure of substrate/TCO/Mo/CIGS/CdS/TCO suggested for substrate-incident laser processing, and a thin-film solar cell module structure manufactured by the processing technology. However, this technology suggested in the above-identified Korean patent application may likely cause damage of the TCO rear electrode during separation of the CIGS light absorption layer by laser heating the interface of TCO/Mo or TCO/CIGS, and thus it may be difficult to implement a small line width of about 50 μm or less in the second and third patterning processes P2 and P3. When the TCO rear electrode is damaged, series resistance of the solar cell module structure may be increased to lower power conversion efficiency. Accordingly, there is a need for a good performance laser processing technology or a cell module structure therefore to implement a smaller line width and minimize damage of the rear electrode.

To separate the CIGS light absorption layer and layers thereon into two regions by such substrate-incident (rear-incident) laser processing (P2 and P3) as described above, the rear electrode adjacent to the substrate must be transparent to laser light so as to allow the laser light to directly heat the interface between the rear electrode and the CIGS light absorption layer. However, in an existing rear electrode structure with a Mo rear electrode adjacent to the substrate, damage of the Mo rear electrode by substrate-incident (rear-incident) laser processing is unavoidable, and accordingly the substrate-incident (rear-incident) laser processing is not applicable.

When TCO as a rear electrode is disposed adjacent to the substrate, there may occur diffusion of impurities such as Na and K from the substrate and impurities such as In, Sn, and O from the TCO rear electrode, and consequently characteristics of the CIGS light absorption layer may be deteriorated. To prevent these drawbacks, there is a need to introduce a functional layer on the TCO rear electrode to prevent diffusion of impurities without deteriorating performance of the electrode.

PRIOR ART DOCUMENT

Patent Document (Patent Document 1) US2013-0168797 A1
(Patent Document 2) US2013-0014800 A1
(Patent Document 3) KR 10-2016-0050929

Non-Patent Document (Non-patent Document 1) T. Nakada, "Microstructural and diffusion properties of CIGS thin-film solar cells fabricated using transparent conducting oxide back contacts", Thin solid films, v. 480-481 (2005) p. 419-425
(Non-patent Document 2) H. Simchi, et al., "Structure and interface chemistry of MoO3 back contacts in CIGS thin-film solar cells", J. Appl. Phys., v. 115 (2014) p. 033514
(Non-patent Document 3) C.-W Jeon, et al., "Controlled formation of $MoSe_2$ by $Mo_x$ thin film as a diffusion barrier against Se during selenization annealing for CIGS solar cell", Journal of Alloys and Compounds, v. 644 (2015) p. 317

SUMMARY

One or more embodiments include a thin-film solar cell module structure having improved power conversion efficiency, productivity, and functionality.

One or more embodiments includes a method of manufacturing the thin-film solar cell module structure, wherein the performance and quality of patterning a light absorption layer by substrate-incident laser processing are improved, leading to improvements in the scribing process in terms of cost, productivity, and precision.

Additional aspects will be set forth in part in the description which follows and, in part, will be apparent from the description, or may be learned by practice of the presented embodiments.

According to one or more embodiments, a thin-film solar cell module structure includes: a transparent substrate; a first rear electrode stacked on the transparent substrate and having transparency; a second rear electrode stacked on the first rear electrode and including a metal nitride layer; a light absorption layer stacked on the second rear electrode and including metal chalcogenide; and a transparent electrode stacked on the light absorption layer, wherein at least a portion of a first stack structure including the first rear electrode and the second rear electrode is separated in a first direction perpendicular to a stacking direction of the first stack structure, at least a portion of a second stack structure including the second rear electrode and the light absorption layer is separated in the first direction, and at least a portion of a third stack structure including the second rear electrode, the light absorption layer, and the transparent electrode is separated in the first direction.

In some embodiments, the thin-film solar cell module structure may further include an auxiliary layer between the light absorption layer and the transparent electrode, wherein the second stack structure may include the second rear electrode, the light absorption layer, and the auxiliary layer, and the third stack structure may include the second rear electrode, the light absorption layer, the auxiliary layer, and the transparent electrode.

In some embodiments, the auxiliary layer may include at least one layer of a buffer layer and a high-resistive window layer.

In some embodiments, the first rear electrode and the transparent electrode may be connected in series through the separated portion of the second stack structure.

In some embodiments, the first rear electrode may include a material having an absorbance of about 20% or less with respect to visible or near-infrared light wavelengths and a resistivity of about $1\times10^{-2}$ Ω·cm or less.

In some embodiments, the first rear electrode may include at least one selected from a transparent conductive oxide (TCO) including at least one selected from an indium (In) oxide, a zinc (Zn) oxide, and a tin (Sn) oxide; a multilayer-structured transparent electrode including a TCO and a metal layer or a nanowire layer and a TCO; and a transparent electrode in which a carbonaceous material including at least one of graphene and carbon nanotubes is dispersed.

In some embodiments, the metal nitride layer may include a metal nitride represented by Formula 1:

<Formula 1> wherein, in Formula 1, $0.4 \leq x \leq 0.9$, $0 \leq y \leq 0.1$, and M may be at least one selected from tungsten (W), molybdenum (Mo), tantalum (Ta), and titanium (Ti).

In some embodiments, the first rear electrode may have a thickness of about 100 nm and about 2,000 nm, and the second rear electrode may have a thickness of about 1 nm to about 200 nm.

In some embodiments, the thin-film solar cell module structure may further include an interfacial adhesive layer between the first rear electrode and the second rear electrode.

In some embodiments, the interfacial adhesive layer may include at least one selected from molybdenum (Mo), tungsten (W), tantalum (Ta), chromium (Cr), nickel (Ni), and titanium (Ti).

In some embodiments, the interfacial adhesive layer may have a thickness of about 1 nm to about 50 nm.

In some embodiments, the thin-film solar cell module structure may further include an ohmic contact layer between the second rear electrode and the light absorption layer.

In some embodiments, the ohmic contact layer may include at least one selected from molybdenum (Mo), gold (Au), a Mo oxide, a tungsten (W) oxide, a nickel (Ni) oxide, an indium titanium oxide (ITO), and a fluorine tin oxide (FTO).

In some embodiments, the ohmic contact layer may have a thickness of about 1 nm to about 50 nm.

In some embodiments, the light absorption layer may include at least one selected from copper (Cu) and silver (Ag), at least one selected from indium (In), gallium (Ga), aluminum (Al), zinc (Zn), and tin (Sn), and at least one selected from selenium (Se) and sulfur (S).

According to one or more embodiments, a method of manufacturing a thin-film solar cell module structure includes: stacking a first rear electrode having transparency on a first surface of a transparent substrate by deposition; stacking a second rear electrode including a metal nitride layer on the first rear electrode by deposition; performing a first laser scribing process to remove at least a portion of a first stack structure including the first rear electrode and the second rear electrode; stacking a light absorption layer including metal chalcogenide on the second rear electrode by deposition; performing a second laser scribing process by irradiating a laser to be incident onto a second surface opposite to the first surface of the transparent substrate to remove at least a portion of a second stack structure including the second rear electrode and the light absorption layer; stacking a transparent electrode on the light absorption layer by deposition; and performing a third laser scribing process by irradiating a laser to be incident onto the second surface of the transparent substrate to remove at least a portion of a third stack structure including the second rear electrode, the light absorption layer, and the transparent electrode.

In some embodiments, the metal nitride layer may include a metal nitride represented by Formula 1:

<Formula 1> wherein, in Formula 1, $0.4 \leq x \leq 0.9$, $0 \leq y \leq 0.1$, and M may be at least one selected from tungsten (W), molybdenum (Mo), tantalum (Ta), and titanium (Ti).

In some embodiments, the performing of the second laser scribing process and the performing of the third laser scribing process may be performed using the second rear electrode as a sacrificial layer. In some embodiments, the second rear electrode may include a material that is vulnerable to thermal shocks with a very high temperature increase rate of, for example, about $1 \times 10^{8\circ}$ C./s or higher, and has an electrical resistivity of about $1 \times 10^{-2}$ Ω·cm or less.

In some embodiments, the first to third laser scribing processes may be performed using a laser pulse scriber having a pulse width of about 0.005 to 50 nanoseconds (ns).

In some embodiments, the laser pulse scriber may perform laser scribing at a laser irradiation intensity of about 0.45 W or less.

In some embodiments, the light absorption layer may be deposited at a temperature of about 400° C. to about 580° C.

In some embodiments, the method may include, instead of the stacking of the transparent electrode on the light absorption layer, stacking an auxiliary layer on the light absorption layer; and stacking the transparent electrode on the auxiliary layer by deposition, wherein the second stack structure may include the second rear electrode, the light absorption layer, and the auxiliary layer, and the third stack structure may include the second rear electrode, the light absorption layer, the auxiliary layer, and the transparent electrode.

In some embodiments, the auxiliary layer may include at least one of a buffer layer and a high-resistive window layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
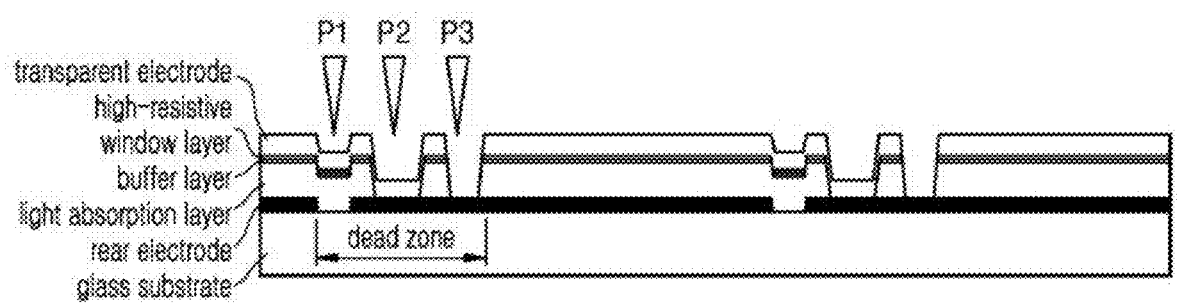
FIG. 1 is a schematic view of a conventional monolithically integrated thin-film solar cell module structure using a molybdenum (Mo) rear electrode.
Figure 2:
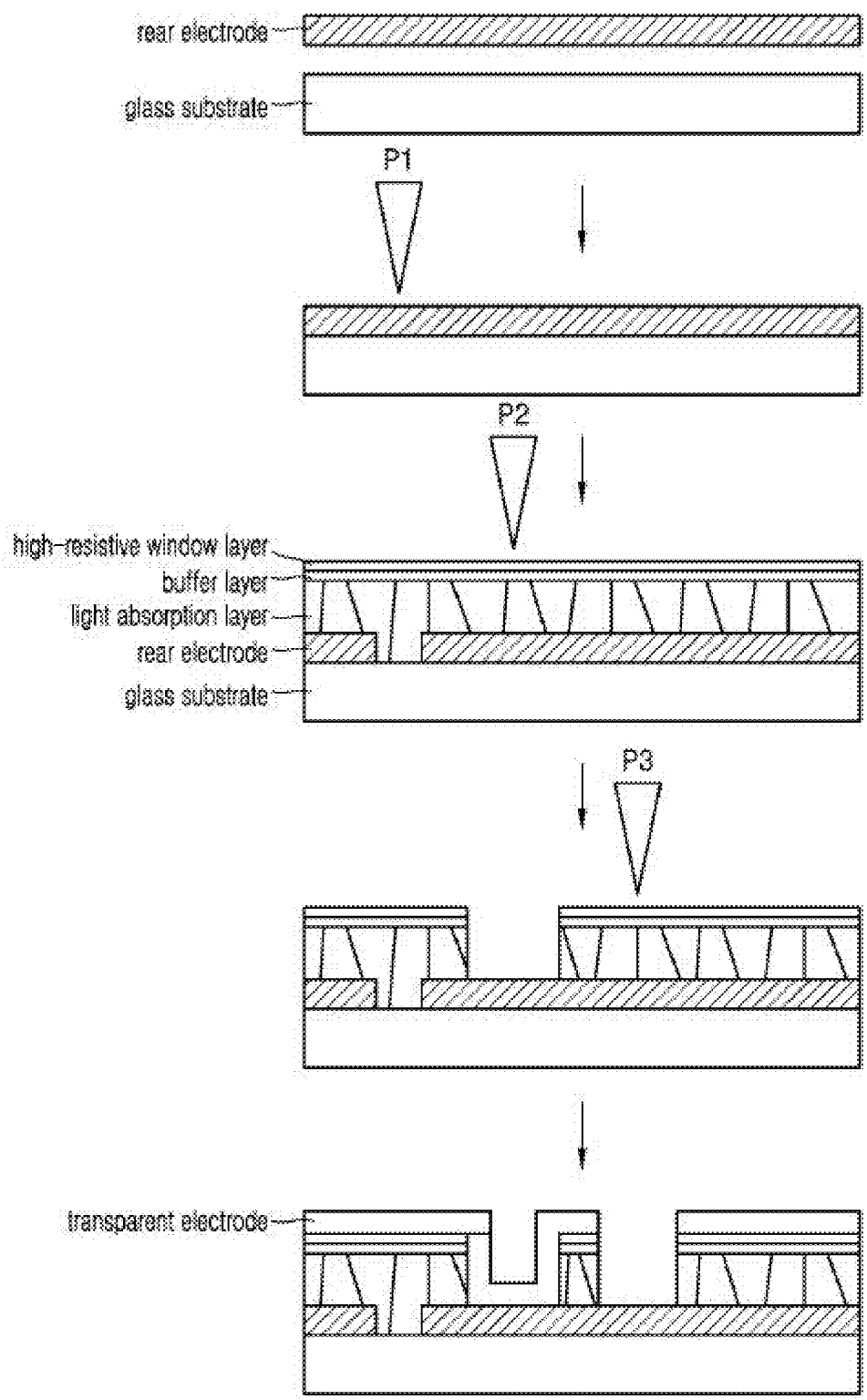
FIG. 2 is a schematic diagram for describing a process of manufacturing the conventional thin-film solar cell module structure of FIG. 1.

The following detailed description of the present disclosure refers to the accompanying drawings which show specific embodiments implemented by the present disclosure. These embodiments are described in detail so as to be easily implemented by those skilled in the art. It should be understood that various embodiments of the present disclosure are different from each other but not exclusive from each other. For example, specific shapes, structures and features written herein can be implemented in other embodiments without departing from the scope of the present disclosure. In addition, it should be understood that locations or arrangements of individual components in each embodiment may be changed without departing from the scope of the present disclosure. Therefore, the following detailed description is not directed to limiting the present disclosure, and the scope of the present disclosure is defined just with the appended claims along and their equivalents, if it is suitably explained. In the drawings, like reference numerals denote like elements throughout several drawings.

Hereinafter, embodiments of a thin-film solar cell module structure and a method of manufacturing the same will be described in greater detail.

According to an aspect of the present disclosure, a thin-film solar cell module structure includes: a transparent substrate; a first rear electrode stacked on the transparent substrate and having transparency; a second rear electrode stacked on the first rear electrode and including a metal nitride layer; a light absorption layer stacked on the second rear electrode and including metal chalcogenide; and a transparent electrode stacked on the light absorption layer, wherein at least a portion of a first stack structure including the first rear electrode and the second rear electrode is separated in a first direction perpendicular to a stacking direction of the first stack structure, at least a portion of a second stack structure including the second rear electrode and the light absorption layer is separated in the first direction, and at least a portion of a third stack structure including the second rear electrode, the light absorption layer, and the transparent electrode is separated in the first direction.

In some embodiments, the thin-film solar cell module structure may further include an auxiliary layer between the light absorption layer and the transparent electrode, wherein the second stack structure may include the second rear electrode, the light absorption layer, and the auxiliary layer, and the third stack structure may include the second rear electrode, the light absorption layer, the auxiliary layer, and the transparent electrode.

According to another aspect of the present disclosure, a method of manufacturing a thin-film solar cell module structure according to an embodiment includes: stacking a first rear electrode having transparency on a first surface of a transparent substrate by deposition; stacking a second rear electrode including a metal nitride layer on the first rear electrode by deposition; performing a first laser scribing process to remove at least a portion of a first stack structure including the first rear electrode and the second rear electrode; stacking a light absorption layer including metal chalcogenide on the second rear electrode by deposition; performing a second laser scribing process by irradiating a laser to be incident onto a second surface opposite to the first surface of the transparent substrate to remove at least a portion of a second stack structure including the second rear electrode and the light absorption layer; stacking a transparent electrode on the light absorption layer by deposition; and performing a third laser scribing process by irradiating a laser to be incident onto the second surface of the transparent substrate to remove at least a portion of a third stack structure including the second rear electrode, the light absorption layer, and the transparent electrode.

In some embodiments, the method of manufacturing the thin-film solar cell module structure may comprise instead of the stacking of the transparent electrode on the light absorption layer by deposition, stacking an auxiliary layer on the light absorption layer; and stacking the transparent electrode on the auxiliary layer, wherein the second stack structure may include the second rear electrode, the light absorption layer, and the auxiliary layer, and the third stack structure may include the second rear electrode, the light absorption layer, the auxiliary layer, and the transparent electrode.

For example, the auxiliary layer may include at least one of a buffer layer and a high-resistive window layer.

As used herein, the term "chalcogenide" refers to a material including, for example, sulfur (S) and/or selenium (Se). The metal chalcogenide may be, for example, $Cu(In_{1-x}, Ga_x)(Se,S)_2$ (CIGS) or $Cu_2ZnSn(Se,S)_4$ (CZTS). However, embodiments are not limited thereto.

As used herein, the first stack structure to the third stack structure may refer to layer structures each including a combination of a substrate, an electrode, and a layer(s), which will be clearly described and understood based on the drawings.

Figure 3:
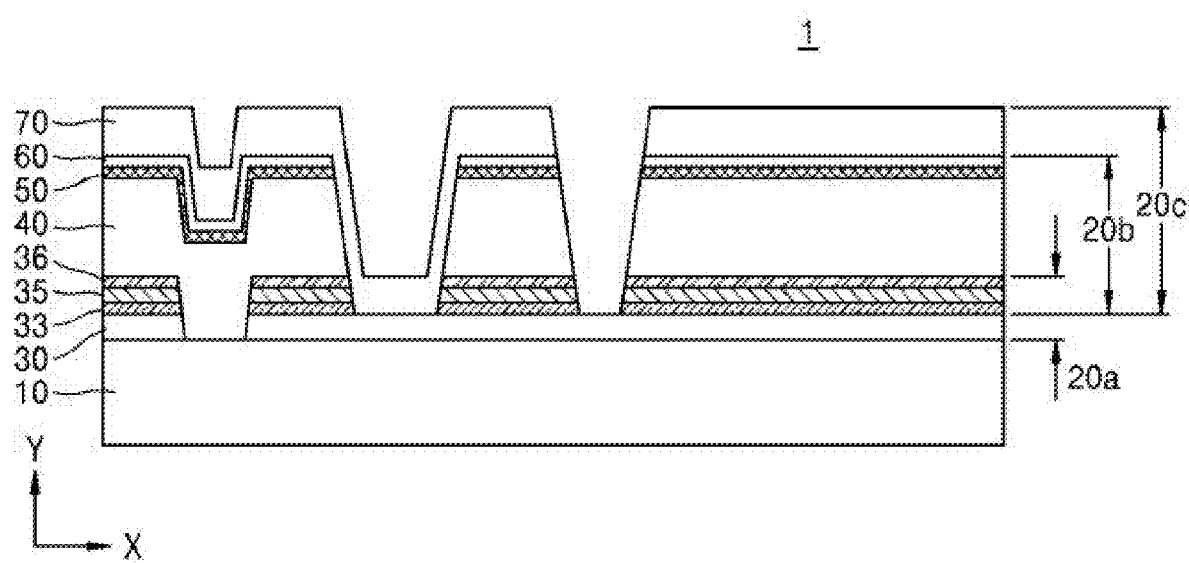
FIG. 3 is a schematic view of a thin-film solar cell module structure having a multilayer rear electrode including a transparent electrode and a metal nitride layer, according to an embodiment.
Figure 4:
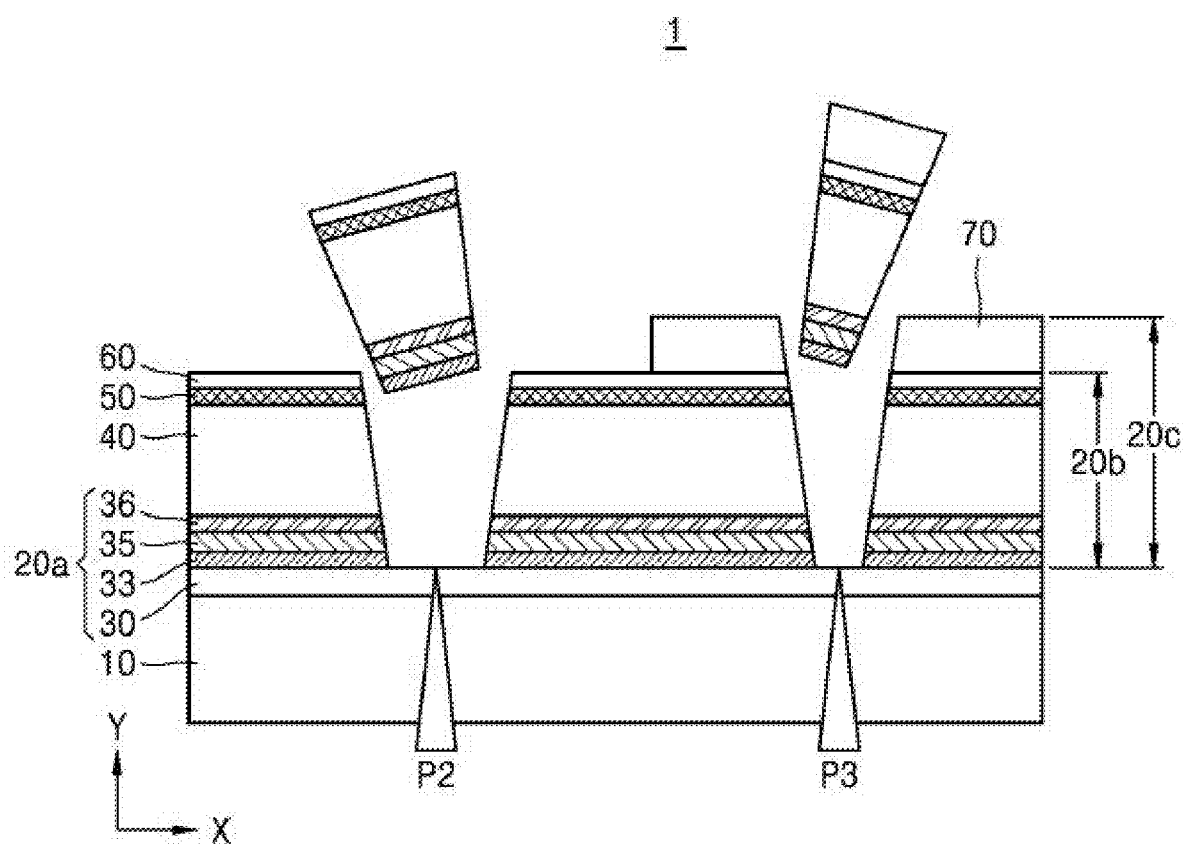
FIG. 4 is a schematic view for describing the concept of laser scribing according to second to third patterning processes to manufacture the thin-film solar cell module structure of FIG. 3.

FIG. 3 is a schematic view of a thin-film solar cell module structure according to an embodiment that allows transmission of laser incident onto a substrate, having a multilayer rear electrode including an electrode having good light transmittance and a metal nitride layer. FIG. 4 is a schematic view for describing the concept of laser scribing according to second to third patterning processes to manufacture the thin-film solar cell module structure of FIG. 3. FIGS. 5A to 5E illustrate a process of manufacturing the thin-film solar cell module structure of FIG. 3, according to an embodiment.

Referring to FIG. 3, a thin-film solar cell 1 may have a monolithically integrated module structure according to an embodiment including: a transparent substrate 10; a first rear electrode 30 stacked on the transparent substrate 10 and having transparency; a second rear electrode 35 stacked on the first rear electrode 30 and including a metal nitride layer; a light absorption layer 40 stacked on the second rear electrode 35 and including metal chalcogenide; a transparent electrode 70 stacked on the light absorption layer 40; and a buffer layer 50 and a high-resistive window layer 60 that are disposed between the light absorption layer 40 and the transparent electrode 70.

In the thin-film solar cell 1, at least a portion of a first stack structure 20a including the first rear electrode 30 and the second rear electrode 35 may be separated in a first direction (X direction) perpendicular to a stacking direction (Y direction) of the first stack structure 20a. At least a portion of a second stack structure 20b including the second rear electrode 35, the light absorption layer 40, the buffer layer 50, and the high-resistive window layer 60 may be separated in the first direction (X direction). At least a portion of a third stack structure 20c including the second rear electrode 35, the light absorption layer 40, the buffer layer 50, the high-resistive window layer 60, and the transparent electrode 70 may be separated in the first direction (X direction).

For example, the first rear electrode 30 and the second rear electrode 35 may together constitute a multilayer rear electrode.

The first rear electrode 30 and the transparent electrode 70 may be connected in series in the separated portion of the second stack structure 20b.

Referring to FIG. 4, to form a series connection structure of a plurality of separate cells in the thin-film solar cell 1, laser may be incident onto a lower surface of the transparent substrate 10 in a patterning process for removing a portion of stacked layers including the light absorption layer 40. That is, unlike a conventional process, a scribing process may be performed by laser irradiation incident onto a second surface of the transparent substrate 10, i.e., opposite to the first surface thereof on which layers such as the transparent electrode 70 are stacked. In this regard, the second rear electrode 35 may be used as a sacrificial layer for efficient processing the light absorption layer 40 in the second laser scribing process P2 and the third laser scribing process P3.

For example, to form the thin-film solar cell 1, the first laser scribing process P1 for separating the first stack structure 20a including the first rear electrode 30 and the second rear electrode 35 parallel in the first direction (X direction); the second laser scribing process P2 for separating the second stack structure 20b including the second rear electrode 35, the light absorption layer 40, the buffer layer 50, and/or the high-resistive window layer 60 at a region adjacent to a separation region of the first stack structure 20a in the first direction (X direction); and the third laser scribing process P3 for separating the third stack structure 20c including the second rear electrode 35, the light absorption layer 40, the buffer layer 50, the high-resistive window layer 60, and the transparent electrode 70 in the first direction (X direction) may be performed.

In the case of performing laser scribing as described above, during at least one of the first to third laser scribing processes P1, P2, and P3, laser having a wavelength that is not absorbable by the transparent substrate 10 but at the same time that is absorbable by a material to be removed may be incident onto the transparent substrate 10. This may enable scribing with low energy by separating, not melting, the material to be removed at an interface due to the concentration of stress by sudden thermal expansion at the interface.

In addition, since the laser incident direction and a debris removal direction are completely different, problems such as re-adsorption of the debris may not occur. Furthermore, since a melting process is unnecessary, the incident energy may be low. Thermal diffusion to neighboring materials is not serious, so that there is no need to use pulsed laser of picoseconds or less. Accordingly, relatively low-price nanosecond (ns) pulsed laser may be applicable.

In a conventional CIGS solar cell module structure typically using a Mo rear electrode opaque to laser light, there was no method applicable to selectively remove only a CIGS light absorption layer, a buffer layer, and a transparent window layer which are formed on the Mo rear electrode, while keeping the Mo rear electrode intact, by applying a substrate-incident laser manner in the second and third scribing processes. On the other hand, when a material transparent to laser light is used for a rear electrode, the material may have a higher resistivity than metal, so that series resistance of the solar cell module structure may be increased. To overcome these drawbacks, it is required to increase the thickness of the rear electrode or to design a very small cell width.

According to embodiments of the present disclosure, even with the first real electrode 30 formed of a transparent material, due to the presence of the second rear electrode 35 including metal nitride, diffusion of impurities from SLG/ITO and interfacial reaction may be suppressed, so that reduction in efficiency caused from the replacement of a conventional opaque rear electrode with the transparent rear electrode may be suppressed irrespective of the processing temperature of the CIGS light absorption layer.

In addition, by using the first rear electrode 30 as a transparent electrode having good light transmittance, instead of the conventional Mo real electrode, and focusing irradiation of laser having a wavelength transmitting through the first rear electrode 30 on the second rear electrode 35 including the metal nitride, delamination at the rear electrode/CIGS interface may be induced.

In the thin-film solar cell 1, the transparent substrate 10 may have a light transmittance of about 90% or greater with respect to light in a visible or near-infrared wavelength range (a wavelength range of about 450 nm to about 1100 nm). For example, soda lime glass, polyimide, or the like may be used in the transparent substrate 10. When a glass substrate is used as the transparent substrate 10, laser having a visible or near-infrared light wavelength (for example, about 1064 nm, or about 532 nm) not absorbed by the glass substrate may be used.

In this case, when laser having a visible light wavelength range (about 532 nm) is applied in the second and third laser scribing processes (P2 and P3), the laser may pass through the first rear electrode 30 absorbing nearly no visible light wavelength, so that heat may focus on the second rear electrode 35 adjacent to the light absorption layer 40, leading to rapid thermal expansion of the second rear electrode 35, and consequently, easy interfacial separation of the first rear electrode 30 and the light absorption layer 40 from one another, without melting. In the region where the second laser scribing process P2 is performed, an interfacial adhesive layer 33 and an ohmic contact layer 36 may be removed together during the laser scribing. Even if they are partially removed and remain very thin after the laser scribing, finally this may insignificantly affect the efficiency of the thin-film solar cell module structure.

In some embodiments, the first rear electrode 30 may include a material having an absorbance of about 20% or less with respect to visible or near-infrared light wavelengths and a specific resistance of about $1\times10^{-2}$ Ω·cm or less. The first rear electrode 30 may have a thickness of about 100 nm to about 2000 nm. The second rear electrode 35 may have a thickness of about 1 nm to about 200 nm, and in some embodiments, about 5 nm to about 50 nm. However, embodiments are not limited thereto. If the thickness of the second rear electrode 35 is greater than these ranges, significant delamination of corresponding thin films formed by a following CIGS light absorption layer deposition process or further subsequent processes may occur.

In this case, the first rear electrode may include at least one selected from a transparent conductive oxide (TCO) including at least one selected from an indium (In) oxide, a zinc (Zn) oxide, and a tin (Sn) oxide; a multilayer-structured transparent electrode including a TCO and a metal layer, or a nanowire layer and a TCO; and a transparent electrode in which a carbonaceous material including at least one of graphene and carbon nanotubes is dispersed. However, embodiments are not limited thereto. For example, any material having low absorbance of light of visible or near-infrared wavelengths may be used.

The indium oxide may be, for example, indium tin oxide (ITO). The zinc oxide may be, for example, ZnO. The tin oxide may be, for example, fluorine tin oxide (FTO). However, embodiments are not limited thereto.

The multilayer-structured transparent electrode may refer to a transparent electrode including TCO/metal layer (or nanowire layer)/TCO, wherein additional layers known in the art may be between the TCO and the metal layer or between the metal layer or the TCO, forming a multilayer structure. The metal layer may include, for example, one of Mo, W, Ta, Cr, Ni, and Ti.

For example, when TCO is used as the first rear electrode 30, the first rear electrode 30 may have a very low absorbance of visible light wavelengths (about 532 nm) but have a considerably high absorbance of near-infrared to infrared light wavelengths (about 1064 nm).

Accordingly, in the first laser scribing process P1, the TCO may be removed by irradiating a laser in a near-infrared to infrared wavelength range (for example, about 1064 nm) or in a visible light wavelength range (for example, about 532 nm) that are absorbable by the TCO. In the second and third laser scribing processes P2 and P3, laser in a visible light wavelength range (for example, about 532 nm) must be used to selectively remove the light absorption layer (for example, CIGS layer) and layer(s) or electrode stacked on the light absorption layer, while remaining the TCO intact. That is, there is a need to consider light wavelengths that are selectively absorbable by each layer for laser processing, which may lower processing efficiency.

However, in the case of the thin-film solar cell module structure including a metal nitride layer as in the present disclosure, laser in a near-infrared to infrared light wavelength range (for example, about 1064 nm) may be applied by modulating light absorption characteristics of the characteristics of the metal nitride layer that may include various combinations of various elements. That is, compared to conventional TCO/CIGS cell module structure, using a rear electrode structure including the metal nitride layer may widen the range of laser wavelengths selectable for the scribing process, so that there is no need to apply different laser wavelengths in each of the first, second, and third laser scribing processes P1, P2, and P3, making ease of the laser processing.

In some embodiments, the second rear electrode 35 may include a material that is vulnerable to thermal shocks with a very high temperature increase rate of, for example, about $1\times10^{8}$° C./s or higher, and has an electrical resistivity of about $1\times10^{-2}$ Ω·cm or less.

The second rear electrode may include a conductive ceramic material having weak resistance against thermal shocks resulting from heating at a high rate.

The second rear electrode may be formed as a single layer or multilayer including at least one of the metal nitrides represented by Formula 1. For example, the metal nitride layer may include a mixture of at least two metals selected from W, Mo, Ta, and Ti. However, embodiments are not limited thereto. For example, nitrogen (N) in the metal nitride represented by Formula 1 may be partially substituted with carbon (C). However, embodiments are not limited thereto. For example, the metal nitride layer may include at least one selected from among $WN_x$, $MoN_x$, $Ti_x$, and $TaN_x$ (wherein $0.4 \leq x \leq 0.9$). However, embodiments are not limited thereto.

When the second rear electrode is formed as a multilayer, the second rear electrode may alternately include the above-described metal nitride layers. In some embodiments, the second rear electrode may alternately include pairs of the metal nitride layer and a metal layer. The metal layer may include tungsten (W), molybdenum (Mo), tantalum (Ta), or titanium (Ti).

The interfacial adhesive layer 33 for increasing interfacial adhesion may be introduced between the first rear electrode 30 and the second rear electrode 35. The interfacial adhesive layer 33 may include at least one selected from Mo, W, Ta, Cr, Ni, and Ti. However, embodiments are not limited thereto. The thickness of the interfacial adhesive layer 33 may be adjusted to be about 1 nm to about 50 nm, and in some embodiments, about 5 nm to about 20 nm. When the thickness of the interfacial adhesive layer 33 is too small out of these ranges, the interfacial adhesive layer may have poor performance. On the other hand, when the thickness of the interfacial adhesive layer 33 is too thick, the interfacial adhesive layer 33 may have poor laser processibility.

In some embodiments, the light absorption layer 40 may include at least one selected from copper (Cu) and silver (Ag), at least one selected from indium (In), gallium (Ga), aluminum (Al), zinc (Zn), and tin (Sn), and at least one selected from selenium (Se) and sulfur (S).

The ohmic contact layer 36 having a high work function may be introduced between the light absorption layer 40 and the second rear electrode 35 to facilitate injection of holes into the light absorption layer 40 which is a p-type semiconductor.

The ohmic contact layer 36 may be stable at about 400° C. to about 600° C. and may have a work function of about 5 eV. The ohmic contact layer 36 may include an interface-adjustable material, for example, at least one of molybdenum (Mo), gold (Au), an oxide of Mo, an oxide of tungsten (W), an oxide of nickel (Ni), SnO:In (ITO), and FTO. The thickness of the ohmic contact layer 36 may be adjusted to be about 1 nm to about 50 nm, and in some embodiments, about 5 nm to about 20 nm. When the thickness of the ohmic contact layer 36 is too small out of these ranges, delamination of the CIGS light absorption layer 40 may be worsen, leading to deteriorated laser processibility and reduced power conversion efficiency.

A generally known TCO material having nearly zero absorbance of visible light wavelengths may have a higher electrical resistivity than metal. For example, ITO as a TCO material having good conductivity may have a resistivity of about $1 \times 10^{-4}$ Ω·cm, which is about 10 times higher than an existing Mo rear electrode having a resistivity of about $1 \times 10^{-5}$ Ω·cm. Such a high resistivity may increase both series resistance caused by a TCO layer used as a window layer and series resistance of the solar cell module structure. Accordingly, to overcome these drawbacks, it is required to increase the thickness of the rear electrode material or to design a very small cell width.

To address these drawbacks, the inventors of the present application found that it could be a solution to improve electrical conductivity of metal nitride of the second rear electrode 35 or to improve conductivity of the ohmic contact layer 36.

As illustrated in FIG. 4, as the second rear electrode 35 and the ohmic contact layer 36 (of electrically conductive) are removed by laser scribing, the regions where the second laser scribing process P2 and the third laser scribing process P3 have been performed may have increased electrical resistance. However, such a resistance increase caused by the removal of conductive layers in the corresponding regions is limited, since a scribing width of the second and third laser scribing processes is as small as about 10 µm to about 200 µm. Furthermore, it may also be possible to minimize the resistance increase in the second laser-scribed region (P2 region) by deposition of the transparent electrode 70, and to minimize the resistance increase in the third laser-scribed region (P3 region) by reducing the scribing line width.

FIGS. 5A to 5E are schematic views illustrating a method of manufacturing the thin-film solar cell module structure of FIG. 3, according to an embodiment.

According to an embodiment, the method of manufacturing the thin-film solar cell module structure may include: stacking a first rear electrode 30 having transparency on a first surface 10a of a transparent substrate 10 by deposition; stacking a second rear electrode 35 including a metal nitride layer on the first rear electrode 30 by deposition; performing a first laser scribing process (P1) to remove at least a portion of a first stack structure 20a including the first rear electrode 30 and the second rear electrode 35; stacking a light absorption layer 40 including metal chalcogenide on the second rear electrode 35 by deposition; stacking a buffer layer 50 and a high-resistive window layer 60 on the light absorption layer 40 by deposition; performing a second laser scribing process P2 by irradiating a laser to be incident onto a second surface 10b opposite to the first surface 10a of the transparent substrate 10 to remove at least a portion of a second stack structure 20b including the second rear electrode 35, the light absorption layer 40, the buffer layer 50, and/or the high-resistive window layer 60; stacking a transparent electrode 70 on the high-resistive window layer 60 by deposition; and performing a third laser scribing process P3 by irradiating a laser to be incident onto the second surface 10b of the transparent substrate 10 to remove at least a portion of a third stack structure 20c including the second rear electrode 35, the light absorption layer 40, the buffer layer 50, the high-resistive window layer 60, and the transparent electrode 70.

For example, the first rear electrode 30 and the second rear electrode 35 may constitute a double-layered rear electrode, i.e., including the first rear electrode 30 and the second rear electrode 35.

Figure 5:
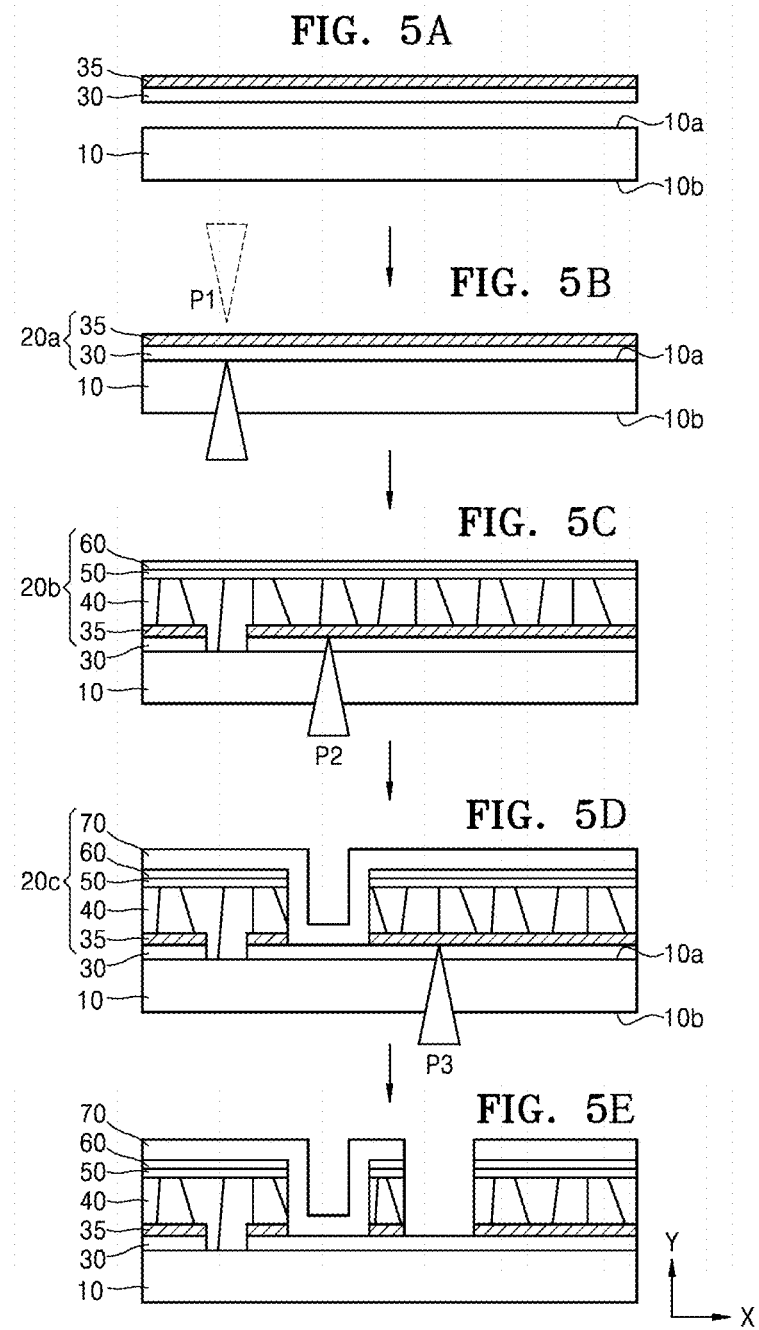
FIGS. 5A to 5E are schematic views illustrating a method of manufacturing the thin-film solar cell module structure of FIG. 3, according to an embodiment.

As illustrated in FIG. 5B, at least a portion of the first stack structure 20a including the double-layered rear electrode (30, 35) may be removed by the first laser scribing process P1 to remove at least a portion of, i.e., pattern the first stack structure 20a.

In this case, laser may be irradiated in either a substrate-incident manner (denoted by solid line) or a thin-film surface-incident manner (denoted by dotted lines). When laser having a wavelength which is not absorbable by the transparent substrate 10 but is absorbable by the double-layered rear electrode (30, 35) to be removed at the same time is incident onto the transparent substrate 10, delamination may occur at the interface of the double-layered rear electrode due to the concentration of stress thereon by rapid thermal expansion, enabling scribing with low energy. Consequently, at least a portion of the first stack structure 20a may be removed at intervals in the first direction (X direction).

Referring to FIG. 5C, after the scribing process of the double-layered rear electrode (30, 35), the light absorption layer 40 may be stacked by deposition. At least one of the buffer layer 50 and the high-resistive window layer 60 may be stacked on the light absorption layer 40 by deposition. Thereafter, the second laser scribing process P2 may be performed to remove at least a portion of the second stack structure 20b. Similar to the first laser scribing process P1, the second laser scribing process P2 may be performed in a substrate-incident manner (denoted by solid lines) by irradiating a laser to be incident onto the second surface 10b of the transparent substrate 10.

The second laser scribing process P2 may be performed on a region adjacent to the region where the first laser scribing process P1 has been performed. Accordingly, a region of the second stack structure 20b adjacent to the removed portion (P1 region) of the first stack structure 20a may be removed parallel to a first laser scribing process (P1) line. In this case, the second rear electrode 35 used as a sacrificial layer may be removed together with the region of the second stack structure 20b.

Referring to FIG. 5D, the transparent electrode 70 may be then deposited to be connected to the first rear electrode 30 in the second laser-scribed region (P2 region), thereby completing a series connection between adjacent cells. Thereafter, the third laser scribing (P3) process may be performed by irradiating a laser to be incident onto the second surface 10b of the transparent substrate 10. In this case, the second rear electrode 35 used as a sacrificial layer may be removed together with a portion of the third stack structure 20c.

Consequently, as illustrated in FIG. 5E, adjacent cells may be electrically insulated by being separated from one another.

In such a thin-film solar cell module structure, an additional fourth laser scribing process P4 may be more easily applicable thereto after the modulation, allowing easier control of light transmittance. It may also be easy to control line widths and intervals, so that the thin-film solar cell module structure may serve as a skylight window without causing visual discomfort. In the fourth laser scribing process P4, the scribing direction may be parallel to that in the first to third laser scribing processes P1, P2 and P3, and in some embodiments, may be perpendicular thereto. To prevent further deterioration beyond unavoidable reduction in photocurrent for increased light transmittance, the fourth laser scribing (P4) lines may be perpendicular to that in the first to third laser scribing processes P1, P2, and P3. It may also be possible to implement various patterns, in addition to such linear penetrating patterns as described above, in the fourth laser scribing process P4. Through such designing the fourth laser scribing process P4, various patterns or designs may be added to window-type (see-through) building-integrated photovoltaics (BIPVs).

In the double-layered rear electrode including the first and second rear electrodes 30 and 35, which include a transparent material and a metal nitride layer, respectively, formed on a glass substrate as described above, window-type BIPV modules may be implemented to provide residents in the building with various colors of light, by using a reflection interference phenomenon at the transparent material/metal nitride layer interface, the transparent material/glass substrate interface, and the glass substrate surface due to indoor lighting. Furthermore, by controlling a material and characteristics of an interfacial adhesive layer introduced at the transparent material/metal nitride layer interface, the window-type BIPV module may be provided with an additional controllability for adjusting a window color for residents in the building.

Hereinafter, effects of the present disclosure will be described in greater detail with reference to the following experimental embodiments.

First, effects on cell efficiency were compared when a Mo thin film widely used as a rear electrode in a conventional CIGS solar cell was replaced with other materials.

Figure 6:
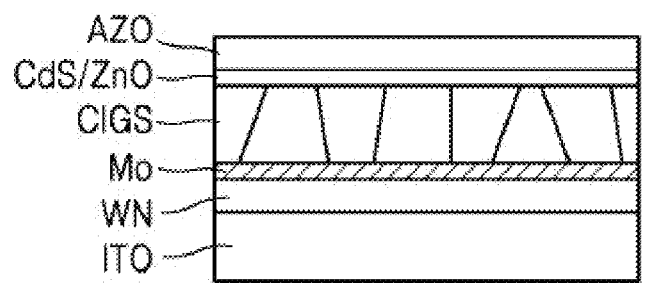
FIG. 6 is a schematic view of a copper-indium-gallium-selenide (CIGS) thin-film solar cell module structure including a tungsten nitride (WN) thin film as a rear electrode structure, according to an embodiment.

FIG. 6 is a schematic view of a CIGS thin-film solar cell module structure including a tungsten nitride (WN) thin film in a rear electrode structure, according to an embodiment.

In general, problems with using ITO as a rear electrode of a CIGS solar cell are the formation of an n-type $Ga_2O_3$ reaction layer that forms a high interface barrier at the ITO/CIGS interface, and increased series resistance due to a relative high resistivity of ITO compared to a Mo metal electrode, as described above. Accordingly, to suppress the formation of the $Ga_2O_3$ reaction layer, the CIGS light absorption layer was deposited at a low temperature of about 450° C.

Next, after CdS having, for example, a thickness of about 50 nm was deposited by chemical bath deposition (CBD), high-resistive ZnO (about 50 nm thickness) and aluminum (AD-doped ZnO (AZO, about 500 nm thickness) were deposited by radio frequency (RF) sputtering.

A rear electrode structure (Comparative Example 3) in which an Mo thin film having a thickness of about 30 nm was further included between the ITO rear electrode having a thickness of about 200 nm and the CIGS light absorption layer to enhance ohmic contact characteristics was compared with a rear electrode structure (Example 1) in which a tungsten nitride ($W_xN_{1-x}$, wherein x may be about 0.5 (hereinafter, as referred to "WN")) thin film having a thickness of about 30 nm was further included as a sacrificial layer between an ITO thin film and a Mo thin film, as illustrated in FIG. 6.

In Example 1, the tungsten nitride (WN) thin film was deposited by pulsed DC magnetron sputtering, in which sputtering was performed against a tungsten (W) target having a diameter of about 3 inches with a mixed gas of argon (Ar) and nitrogen ($N_2$) in a volume ratio of about 1:5 under a pressure of about 3 mtorr with a 150 W pulsed DC power (20 kHz, 80% duty cycle), followed by deposition at a substrate temperature of about 450° C. for about 5 minutes. The resulting deposited tungsten nitride ($W_xN_{1-x}$) thin film had a resistivity of about $1.5 \times 10^{-4}$ Ω·cm.

Figure 7:
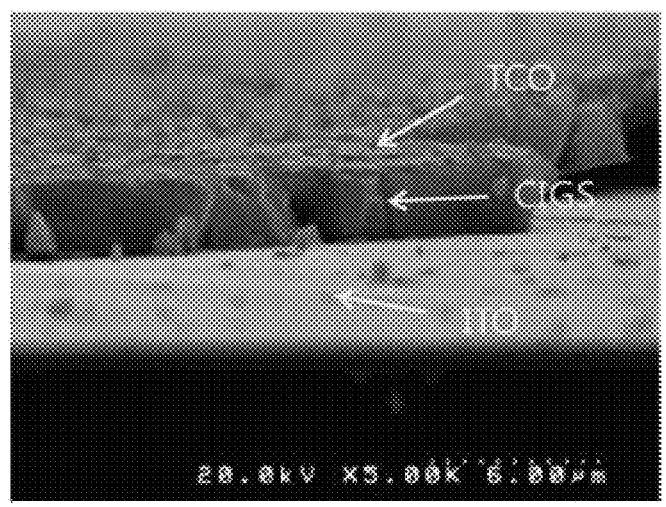
FIG. 7 is a scanning electron microscope (SEM) image showing delamination of a light absorption layer in the thin-film solar cell module structure of FIG. 6 including a WN thin film as a rear electrode structure.

FIG. 7 is a scanning electron microscope (SEM) image showing delamination of a light absorption layer in the thin-film solar cell module structure (of FIG. 6) including a WN thin film in a rear electrode structure.

When a WN thin film is applied as a sacrificial layer, the CIGS light absorption layer and layers thereon are more likely be delaminated after the manufacture of the solar cell, as shown in the SEM image of FIG. 7. This is attributed to insufficient interfacial adhesion between the WN thin film and the underlying ITO thin film. Thus, to solve this problem, in Example 1 the Mo thin film was deposited to a thickness of about 10 nm or less between the ITO thin film and the WN thin film.

Rear electrodes were manufactured in the same manner as described above, except that Mo (Comparative Example 1), ITO (Comparative Example 2), ITO/Mo (Comparative Example 3), ITO/WN/Mo (Example 1) were used, respectively, and then at the same time subjected to following deposition processes, thereby manufacturing CIGS thin-film solar cell structures including the rear electrodes, respectively.

Figure 8:
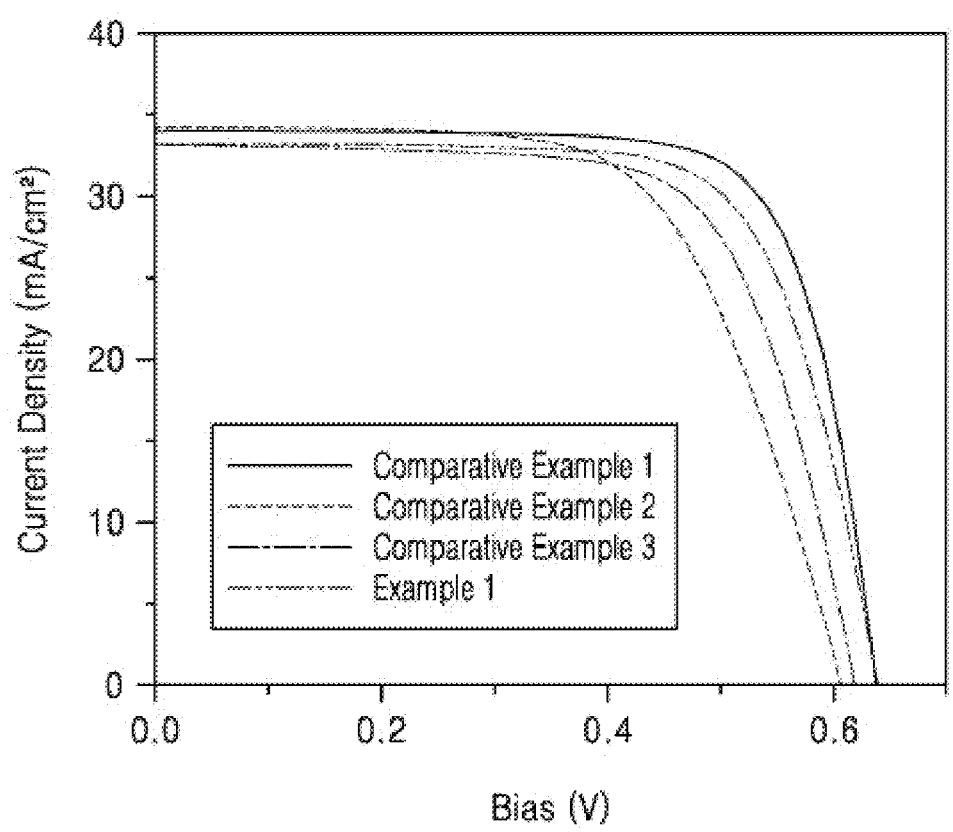
FIG. 8 illustrates current-voltage curves of the CIGS thin-film solar cells of Example 1 and Comparative Examples 1 to 3.

Current-voltage curves and cell power conversion efficiency parameters of the CIGS thin-film solar cells of Example 1 and Comparative Examples 1 to 3 measured under standard conditions (air mass 1.5, under one sun condition) are shown in FIG. 8 and Table 1.

FIG. 8 illustrates current-voltage curves of the CIGS thin-film solar cells of Example 1 and Comparative Examples 1 to 3.

TABLE 1

Power conversion efficiency parameters of CIGS thin-film solar cells including different electrode structures

| Example | Rear electrode structure | Efficiency [%] | $V_{OC}$ [mV] | $J_{SC}$ [mA/cm$^2$] | FF [%] |
|---|---|---|---|---|---|
| Comparative Example 1 | SLG/SiO$_x$/Mo(500 nm) | 16.2 | 0.640 | 34.1 | 74.3 |
| Comparative Example 2 | SLG/ITO(200 nm) | 13.2 | 0.609 | 34.3 | 62.9 |
| Comparative Example 3 | SLG/ITO(200 nm)/Mo(30 nm) | 14.1 | 0.621 | 33.3 | 68.1 |
| Example 1 | SLG/ITO(200 nm)/WN/Mo(30 nm) | 15.2 | 0.641 | 33.3 | 71.0 |

Referring to FIG. 8 and Table 1, the solar cell of Comparative Example 2 using the ITO rear electrode had a significantly reduced photovoltage and fill factor (FF), compared to the solar cell of Comparative Example 1 using the Mo rear electrode. This is attributed to increased series resistance due to a high sheet resistance of the ITO rear electrode, an interface barrier of reaction products in the ITO/CIGS interface, and deterioration of the CIGS light absorption layer caused by diffusion of impurities from the ITO and the substrate. In the solar cell of Comparative Example 3 using the ITO/Mo rear electrode, the FF and the photovoltage were slightly recovered, which is estimated due to improved series resistance and interface characteristics due to the addition of Mo (30 nm).

On the other hand, the solar cell of Example 1 including a WN thin film (30 nm) had an increased photovoltage similar to the level of the solar cell of Comparative Example 1 using the Mo rear electrode, and a significantly improved FF, indicating that the introduction of the WN thin film may substantially contribute to power conversion efficiency improvement. A slightly higher series resistance compared to the Mo rear electrode is due to a higher resistance of the ITO/WN/Mo rear electrode structure compared to the single-layer Mo electrode. A marked effect of introducing the WN is the recovered photovoltage similar to the level of the single-layer Mo electrode. This may be attributed to the efficient blocking of impurity diffusion from the underlying SLG/ITO by the WN thin film.

Figure 9A:
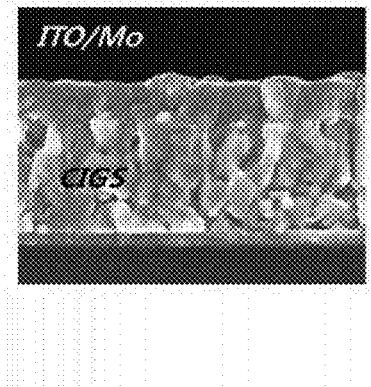
FIG. 9A is a SEM image of a microstructure of a CIGS light absorption layer of the solar cell of Comparative Example 1 using an Mo rear electrode, manufactured through a CIGS light absorption layer process at 450° C.
Figure 9B:
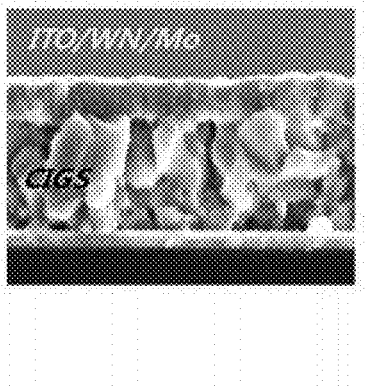
FIG. 9B is a SEM image of a microstructure of a CIGS light absorption layer of the solar cell of Example 1 using the ITO/WN/Mo rear electrode, manufactured through a CIGS light absorption layer process at 450° C.

FIG. 9A is a SEM image of a microstructure of a CIGS light absorption layer of the solar cell of Comparative Example 1 using the Mo rear electrode, manufactured through a CIGS light absorption layer process at 450° C. FIG. 9B is a SEM image of a microstructure of a CIGS light absorption layer of the solar cell of Example 1 using the ITO/WN/Mo rear electrode, manufactured through a CIGS light absorption layer process at 450° C.

Referring to FIGS. 9A and 9B, when a WN thin film is introduced as in Example 1, the overall crystallinity of the CIGS light absorption layer was increased compared to the solar cell of Comparative Example 1 using the Mo rear electrode, due to increased diffusion rate of the constituent elements of the CIGS light absorption layer resulting from blocking diffusion of Na from the soda-lime glass substrate. As a result, the CIGS light absorption layer had increased crystallinity, and the density of defects causing loss of photovoltage was reduced.

Figure 10:
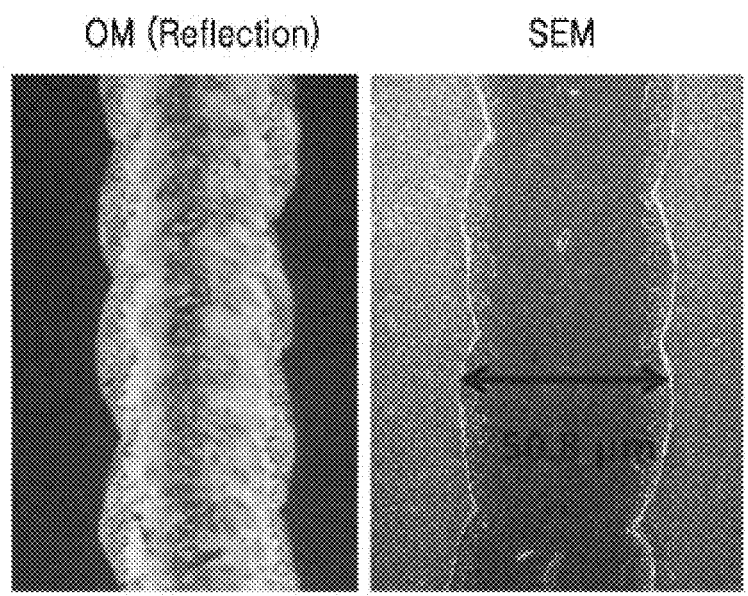
FIG. 10 shows optical microscope (OM) and SEM images as results of processing a CIGS light absorption layer of a SLG/ITO/CIGS cell by applying substrate-incident nanosecond (ns) laser pulses with a beam size of about 50 μm (0.24 W)
Figure 11:
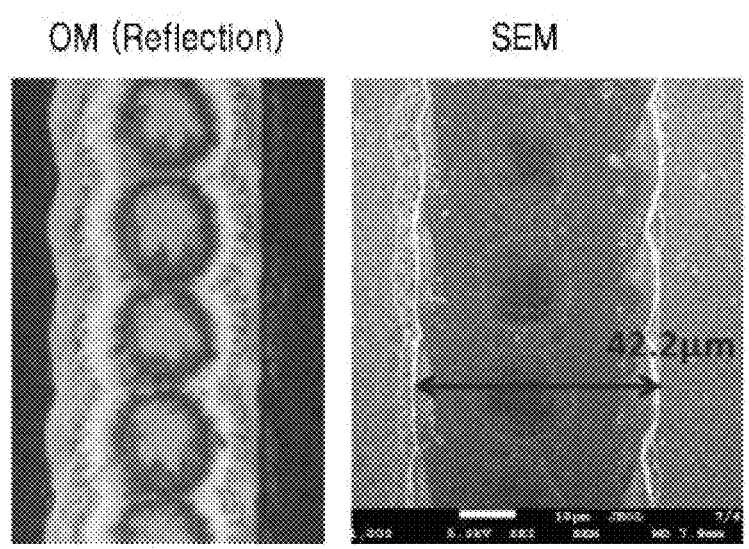
FIG. 11 shows OM and SEM images as results of processing a CIGS light absorption layer of a SLG/ITO/CIGS cell by applying substrate-incident nanosecond (ns) laser pulses with a beam size of about 40 μm (0.11 W)
Figure 12:
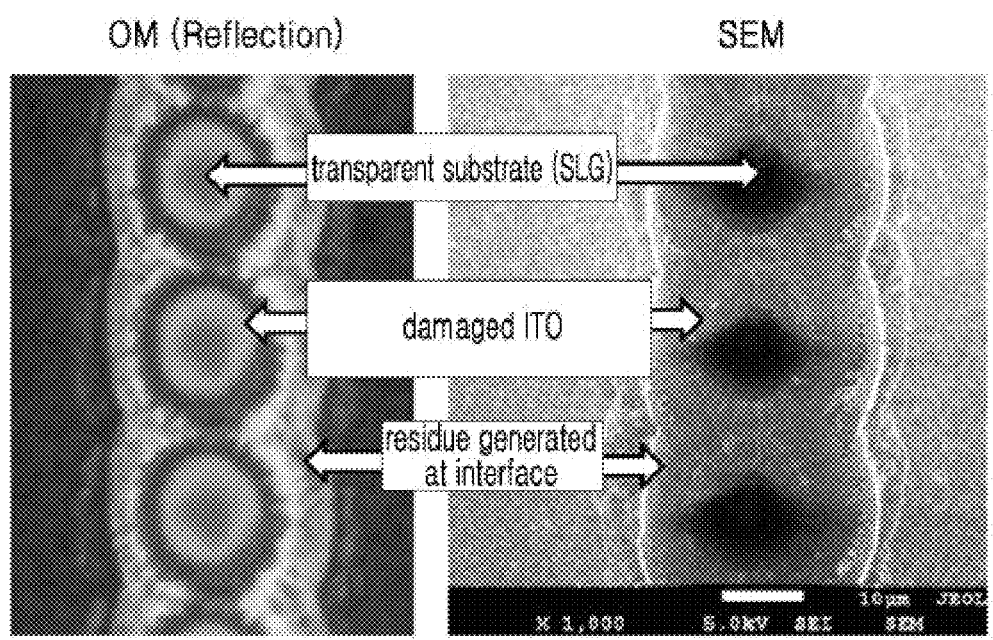
FIG. 12 shows OM and SEM images as results of processing a CIGS light absorption layer of a SLG/ITO/CIGS cell by applying substrate-incident nanosecond (ns) laser pulses with a beam size of about 26 μm (0.05 W)

FIGS. 10 to 12 are optical microscope (OM) and SEM images as results of processing a CIGS light absorption layer of a SLG/ITO/CIGS cell having a SLG/ITO/CIGS/CdS/i-ZnO/AZO structure by applying substrate-incident nanosecond (ns) laser pulses with a different laser beam size.

As shown in the OM and SEM images of FIG. 10, when the laser beam size was about 50 µm, delamination at the ITO/CIGS interface by the laser heating was effective, so that it was possible to process the CIGS light absorption layer with minimized damage of ITO. However, as shown in FIGS. 11 and 12, when the laser beam size was reduced to about 40 µm and 26 µm, damage of ITO tended to become more serious, indicating that it may be not easy to implement a line width of about 50 µm or less in the ITO/CIGS structure by using nanosecond laser pulses.

Figure 13:
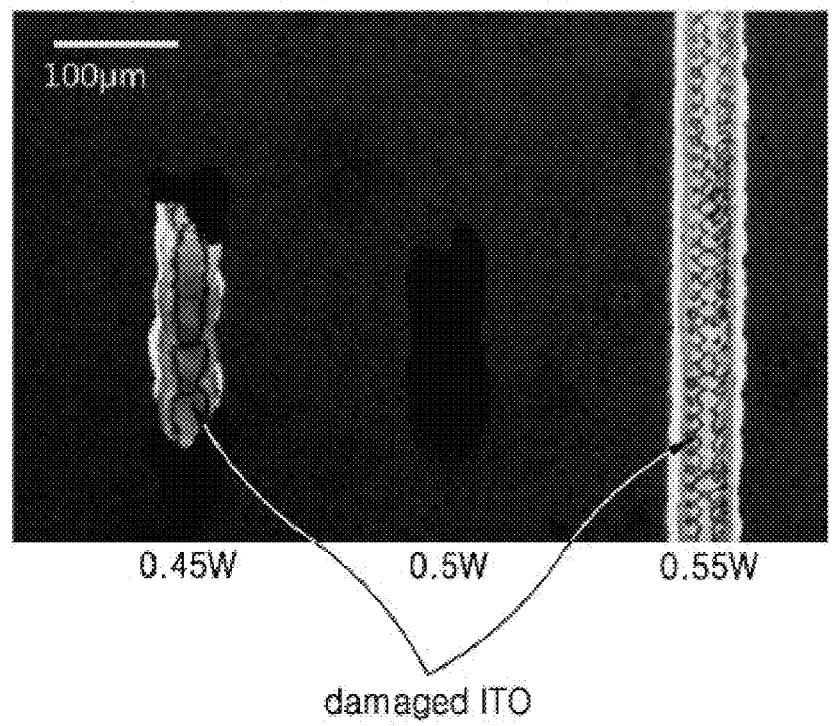
FIG. 13 is an OM image illustrating results of processing a CIGS light absorption layer in a SLG/ITO/Mo/CIGS cell by applying substrate-incident nanosecond (ns) laser pulses with a different laser irradiation intensity.

FIG. 13 is an OM image showing results of scribing a CIGS light absorption layer and thin films thereon in CIGS solar cell module having a SLG/ITO/Mo (30 nm) rear electrode structure(SLG/ITO/Mo/CIGS/CdS/i-ZnO/AZO) by applying substrate-incident nanosecond (ns) laser pulses (532 nm) with different laser irradiation intensities. As shown in FIG. 13, in the solar cell having such an Mo rear electrode structure, a relatively high laser intensity is required to process the CIGS light absorption layer, and damage of the ITO thin film, as appearing in the middle of process lines resulting from processing with a laser of 0.55 W, is also unavoidable.

Figure 14:
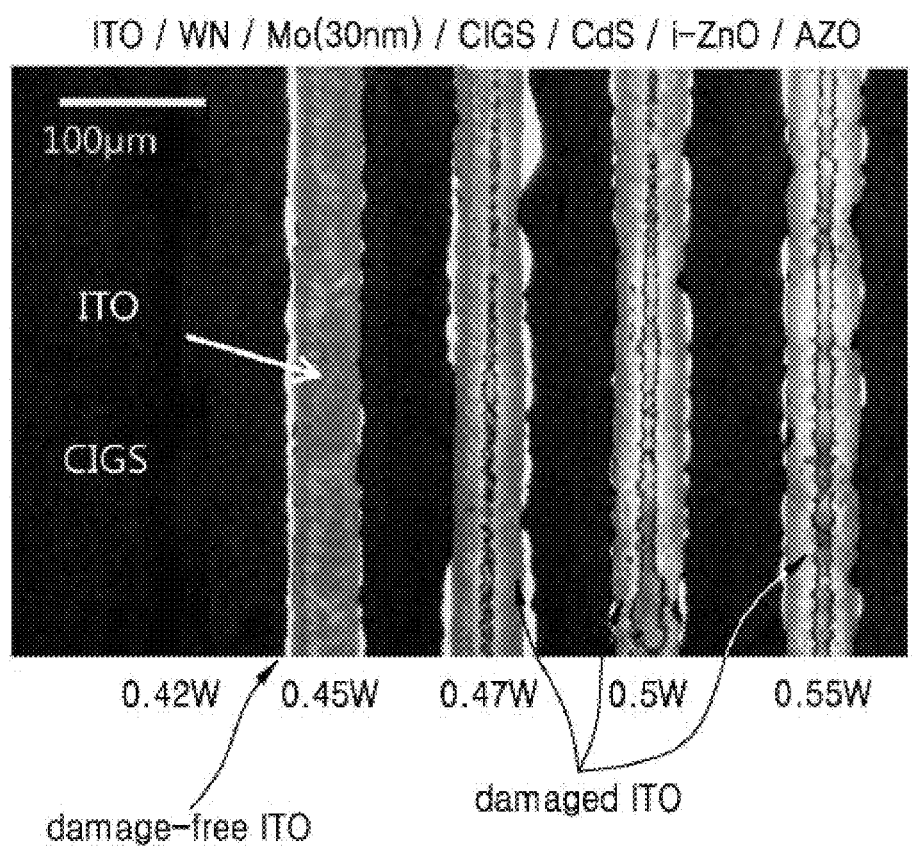
FIG. 14 is an OM image illustrating results of processing a CIGS light absorption layer of a SLG/ITO/WN/Mo/CIGS cell by applying substrate-incident nanosecond (ns) laser pulses with a different laser irradiation intensity, according to embodiments.

On the other hand, when a WN sacrificial layer was applied, it was possible to process CIGS light absorption layer with minimized damage of ITO. FIG. 14 is an OM image showing results of processing a CIGS light absorption layer in a SLG/ITO/WN/Mo/CIGS cell by applying substrate-incident nanosecond (ns) laser pulses with a different laser irradiation intensity, according to embodiments.

Compared to the results of FIG. 13, the results of FIG. 14 show that the CIGS light absorption layer can be processed with a lower laser intensity, and processing conditions for processing the CIGS light absorption layer without damage of the ITO thin film, as apparent from the processing result at a laser intensity of about 0.45 W.

As described above, to improve the power conversion efficiency of the such a monolithically integrated thin-film solar cell module structure, there are required to reduce a second and third laser scribing (P2 and P3) line width to about 10 µm to about 20 µm so as to reduce a dead zone area where photovoltaic power generation is impossible, and to prevent shunting of individual cells in the module caused by debris or damage resulting from such as melting of the light absorption layer and neighboring materials during the scribing processes.

To this end, laser processing technologies may be applied to the first and third scribing processes P2 and P3. Currently, a transparent window layer-incident manner (irradiating laser to be incident onto the transparent window layer in a direction opposite to the substrate) is applied, and very short laser pulses of about tens-of-picoseconds (ps) or less is applied to ensure selective heating between the region to be removed and the region to remain unremoved (i.e., the rear electrode). However, the price of picoseconds (ps) laser pulses or femtoseconds (fs) laser pulses is high, increasing initial investment costs for a photovoltaic module production line.

However, in a transparent window layer-incident laser manner, during scribing laser is incident in the direction in which debris is removed. Accordingly, there may occur problems such as sticking of the debris to the scribing region. If a relatively low-price nanoseconds (ns) laser having a pulse width of about 1 ns to about 50 ns is applicable, the module efficiency may be improved with reduced manufacturing cost.

Coping with the window-type BIPV market, an amorphous Si solar cell module having partial transparency has been commercialized, which was manufactured by removing a light absorption layer by laser scribing. In contrast, the CIGS thin-film solar cell module structure having an existing structure as illustrated in FIG. 1, it is very difficult to transmit light through the first, second, and third scribing (P1, P2, and P3) regions, due to good light absorption ability of the light absorption layer and light absorption or reflection by the Mo rear electrode. As described above, CIGS thin-film solar cells have higher power conversion efficiency than any existing thin-film solar cells, and accordingly may also have high competitiveness in the BIPV market if light transparency is ensured.

According to the present disclosure, a rear electrode structure including WN thin film may be introduced into such a CIGS thin-film solar cell, thereby minimizing damage of a transparent rear electrode and processing a CIGS light absorption layer having a smaller line width.

According to the present disclosure, innovations in module manufacturing technologies may be achieved by markedly improving processability in the second laser scribing process (P2), which matters most among the scribing processes in manufacturing CIGS thin-film solar cell module structures, and the second and third laser scribing (P2 and P3) line widths may be reduced to about 10 µm to about 20 µm, thus to markedly reduce the non-photovoltaic dead zone area. Consequently, these may remarkably improve performance of the solar cell module structure.

A window-type photovoltaic module as described above should allow residents inside the building to control the intensity of the skylight to various levels and to tune the colors of the skylight to satisfy aesthetic needs. Leaving aside the option to enable the user's active control of the intensity and color of the skylight transmittance through the module after manufacture of the product is completed, it should be possible to produce various designs of solar cell module in which the intensity and color of the skylight the product allows to pass through have been tuned to comply with the customers' needs. According to the present disclosure, manufacturing process costs may be reduced, with the expectation of ensured competitiveness in the BIPV market.

As described above, according to embodiments of a thin-film solar cell module structure and a method of manufacturing the same, unlike when a conventional Mo rear electrode is applied, i.e., when it was impossible to selectively remove only a CIGS light absorption layer, a buffer layer, and a transparent window layer that are formed on the Mo rear electrode, while remaining the Mo rear electrode unremoved, in a substrate-incident laser manner, due to the Mo rear electrode opaque to laser light, a transparent material having good light transmittance may be applied to a surface of one of the rear electrodes adjacent to a substrate, so that a scribing process for thin-film solar cell modulation may be performed in a substrate-incident laser manner.

Furthermore, as a metal nitride layer is introduced between the rear electrode including the transparent material (hereinafter, "transparent electrode" (or "first rear electrode")) and a light absorption layer, due to a thermal shock from rapid thermal expansion of the metal nitride layer under heating conditions at about 1,000° C. or higher with applying laser pulses for tens of nanoseconds (ns), the metal nitride layer may be delaminated, facilitating interfacial delamination between the first rear electrode and the light absorption layer. This may facilitate delamination of the light absorption layer in manufacturing a copper-indium-gallium-selenide (CIGS) thin film solar cell module structure, so that the manufacturing process may be performed with reduced laser intensity. Consequently, heat diffusion to the first rear electrode using transparent conductive oxide (TCO) may be reduced, and only the light absorption layer may be processed with improved selectivity.

Furthermore, since it is possible to remove the light absorption layer simply by heating at a relatively low temperature, there is no need to use expensive laser sources such as picoseconds (ps) and femtoseconds (fs) laser pulses to block the heat diffusion to peripheral regions caused by highly cumulated heat. Thus, the CIGS solar cell module may be manufactured using a low-price nanosecond (ns) laser pulse scriber, lowering manufacturing costs.

As a double-layered rear electrode including a transparent electrode and a metal nitride layer is applied, it may be possible to prevent interference effects (resulting in, for example, a reaction product, incomplete binding, etc.) of the transparent material, which may occur during deposition of CIGS when a transparent rear electrode is used alone, ensuring the manufacture of high-efficiency solar cell module structures. Through controlling the composition and structure of the metal nitride layer, the electrical resistivity of the rear electrode may be reduced compared to when a transparent rear electrode is used alone, increasing the fill factor (FF) of the solar cell.

The introduced metal nitride layer may efficiently block diffusion of impurities from the substrate or the transparent rear electrode in the deposition process of the light absorption layer, thus improving quality of the light absorption layer and consequently increasing power conversion efficiency.

When a rear electrode including only a transparent oxide material is applied, a reaction product ($Ga_2O_3$) between the transparent rear electrode and the light absorption layer may be formed during high-temperature (550° C.) deposition of the CIGS light absorption layer, blocking charge transfer. Accordingly, to suppress such formation of $Ga_2O_3$, a low-temperature CIGS deposition process at 500° C. or less must be applied. However, when a metal nitride layer is introduced into the rear electrode, such a reaction product may not be formed even with the high-temperature process at about 550° C. or greater, which may have the effect of widening a cell manufacturing process window for high efficiency.

Furthermore, when a thin-film solar cell module structure according to any of the embodiments is applied, laser processing performance may be improved when the light absorption layer is processed in a substrate-incident laser manner to ensure transparency (P4 scribing), due to the second rear electrode including the metal nitride layer serving as a sacrificial layer. Compared to when a substrate-incident laser process is applied to a conventional CIGS thin-film solar cell module structure including only a single Mo rear electrode as illustrated in FIG. 1, laser processibility may be markedly improved when a transparent conductive oxide (TCO) is used as part of the rear electrode as suggested in the present disclosure.

Furthermore, when a technology according to any one of the embodiments of the present disclosure is applied to a window-type solar cell module structure, interference from reflected light caused by indoor lighting may occur at a surface of the glass substrate of the solar cell module structure placed toward the inside of the building, at the interface of the transparent material layer/metal nitride layer, and at the interface of the glass substrate/transparent material layer. Such a reflected light interference effect may be controllable by controlling the interfacial distance between layers constituting the rear electrode and material characteristics of the metal nitride layer and the interfacial adhesive layer, so that the window-type solar cell module structure may provide residents in the building with various colors of skylight, with good aesthetic effects.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the inventive concept as defined by the following claims.

What is claimed is:

1. A method of manufacturing a thin-film solar cell module structure, the method comprising:
   stacking a first rear electrode having transparency on a first surface of a transparent substrate by deposition;
   stacking a second rear electrode including a metal nitride layer on the first rear electrode by deposition;
   performing a first laser scribing process to remove at least a portion of a first stack structure including the first rear electrode and the second rear electrode;
   stacking a light absorption layer including metal chalcogenide on the second rear electrode by deposition;
   performing a second laser scribing process by irradiating a laser so as to be incident onto a second surface opposite to the first surface of the transparent substrate, and so as to remove at least a portion of a second stack structure including the second rear electrode and the light absorption layer;
   stacking a transparent electrode on the light absorption layer by deposition;
   performing a third laser scribing process by irradiating a laser to be incident onto the second surface of the transparent substrate to remove at least a portion of a third stack structure including the second rear electrode, the light absorption layer, and the transparent electrode, and performing a fourth laser scribing process by irradiating a laser, wherein a scribing direction of the fourth laser scribing process is perpendicular to at least one of scribing directions of the first, second and third laser scribing processes, wherein an interfacial adhesive layer for increasing interfacial adhesion is introduced directly between the first rear electrode and the second rear electrode, and the interfacial adhesive layer comprises at least one selected from molybdenum (Mo), tungsten (W), tantalum (Ta), chromium (Cr), nickel (Ni), and titanium (Ti).

2. The method of claim 1, wherein the metal nitride layer comprises a metal nitride represented by Formula 1:

$$M_x(C_yN_{1-y})_{1-x} \qquad \text{<Formula 1>}$$

wherein, in Formula 1, 0.4≤x≤0.9, 0≤y≤0.1, and M is at least one selected from tungsten (W), molybdenum (Mo), tantalum (Ta), and titanium (Ti).

3. The method of claim 1, wherein the performing of the second laser scribing process and the performing of the third laser scribing process are performed using the second rear electrode as a sacrificial layer.

4. The method of claim 1, wherein the first to third laser scribing processes are performed using a laser pulse scriber having a pulse width of about 0.005 to 50 nanoseconds (ns).

5. The method of claim 1, further comprising:

stacking an auxiliary layer on the light absorption layer before stacking the transparent electrode, wherein the second stack structure further comprises the auxiliary layer, and the third stack structure further comprises the auxiliary layer.

6. The method of claim 5, wherein the auxiliary layer comprises at least one of a buffer layer and a high-resistive window layer.

7. The method of claim 1, wherein the interfacial adhesive layer has a thickness of about 1 nm to about 50 nm.

* * * * *